(12) United States Patent
Matsuda et al.

(10) Patent No.: US 11,664,252 B2
(45) Date of Patent: May 30, 2023

(54) CLEANING DEVICE, POLISHING DEVICE, AND DEVICE AND METHOD FOR CALCULATING ROTATION SPEED OF SUBSTRATE IN CLEANING DEVICE

(71) Applicant: EBARA CORPORATION, Tokyo (JP)

(72) Inventors: Michiaki Matsuda, Tokyo (JP); Hisajiro Nakano, Tokyo (JP); Fuyuki Ogaki, Tokyo (JP); Yusuke Watanabe, Tokyo (JP); Junji Kunisawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 17/787,565

(22) PCT Filed: Dec. 21, 2020

(86) PCT No.: PCT/JP2020/047600
§ 371 (c)(1),
(2) Date: Jun. 20, 2022

(87) PCT Pub. No.: WO2021/132122
PCT Pub. Date: Jul. 1, 2021

(65) Prior Publication Data
US 2022/0406633 A1    Dec. 22, 2022

(30) Foreign Application Priority Data

Dec. 25, 2019    (JP) .............................. JP2019-234071

(51) Int. Cl.
*H01L 21/67*    (2006.01)
*B08B 1/00*    (2006.01)
(Continued)

(52) U.S. Cl.
CPC ........ *H01L 21/67253* (2013.01); *B08B 1/001* (2013.01); *B08B 1/02* (2013.01);
(Continued)

(58) Field of Classification Search
CPC ........... B08B 1/001; B08B 1/02; B08B 3/022; B08B 13/00; H01L 21/67288;
(Continued)

(56) References Cited

U.S. PATENT DOCUMENTS

2019/0378733 A1    12/2019    Hamaguchi et al.

FOREIGN PATENT DOCUMENTS

JP    H09-050980 A    2/1997
JP    2003-077881 A    3/2003
(Continued)

OTHER PUBLICATIONS

Japan Patent Application No. 2019-234071; Notice of Reasons for Refusal; dated Jan. 11, 2022; 6 pages.
(Continued)

*Primary Examiner* — Shay Karls
(74) *Attorney, Agent, or Firm* — BakerHostetler

(57) ABSTRACT

A cleaning device includes: a plurality of rollers that hold a peripheral edge part of a substrate; a rotation driving unit that rotates the substrate by rotationally driving the plurality of rollers; a cleaning member that abuts on the substrate and cleans the substrate; a cleaning liquid supply nozzle that supplies a cleaning liquid to the substrate; a microphone that detects a sound generated when a notch of the peripheral edge part of the substrate hits the plurality of rollers; and a rotation speed calculation unit that calculates a rotation speed of the substrate on the basis of the sound detected by the microphone.

22 Claims, 9 Drawing Sheets

(51) Int. Cl.
  *B08B 1/02* (2006.01)
  *B08B 3/02* (2006.01)
  *B08B 13/00* (2006.01)
  *H01L 21/02* (2006.01)
(52) U.S. Cl.
  CPC .............. *B08B 3/022* (2013.01); *B08B 13/00* (2013.01); *H01L 21/67051* (2013.01); *H01L 21/67219* (2013.01); *H01L 21/67288* (2013.01); *H01L 21/02057* (2013.01)
(58) Field of Classification Search
  CPC ......... H01L 21/67253; H01L 21/67051; H01L 21/67219; H01L 21/02057; H01L 21/67046
  See application file for complete search history.

(56) References Cited

FOREIGN PATENT DOCUMENTS

| | | |
|---|---|---|
| JP | 2006-237456 A | 9/2006 |
| JP | 2014-154814 A | 8/2014 |
| JP | 2016-152382 A | 8/2016 |
| JP | 2018-079453 A | 5/2018 |
| JP | 2019-216153 A | 12/2019 |

OTHER PUBLICATIONS

Japan Patent Application No. 2019-234071; Decision to Grant; dated Apr. 26, 2022; 5 pages.
International Patent Application No. PCT/JP2020/047600; Int'l Search Report; dated Mar. 23, 2021; 5 pages.

CLEANING DEVICE, POLISHING DEVICE, AND DEVICE AND METHOD FOR CALCULATING ROTATION SPEED OF SUBSTRATE IN CLEANING DEVICE

TECHNICAL FIELD

The present disclosure relates to a cleaning device, a polishing device, and a device and a method for calculating a rotation speed of a substrate in the cleaning device.

BACKGROUND ART

In a process of manufacturing a semiconductor device, various processes such as film formation, etching, and polishing are performed on a surface of a substrate such as a semiconductor wafer. Since it is necessary to keep the surface of the substrate clean before and after these various processes, a substrate cleaning process is performed. In the substrate cleaning process, a cleaning machine is widely used which rotates a substrate by holding a peripheral edge part of the substrate by a plurality of rollers and rotationally driving the rollers, and presses a cleaning member against the rotating substrate to clean the substrate.

As described above, in the cleaning machine in which the peripheral edge part of the substrate is held by the plurality of rollers and rotated, the cleaning member applies a predetermined pressure to the surface of the substrate and rubs the surface of the substrate to remove dirt (particles and the like) on the surface of the substrate. Thus, slip may occur between the substrate and the rollers, and the rotation speed of the substrate may be lower than a set rotation speed.

JP 2003-77881 A discloses a technique of detecting vibration generated in a roller when a notch of a rotationally driven substrate hits the roller, and determining whether or not slip has occurred between the substrate and the roller on the basis of the detection of the vibration.

SUMMARY OF INVENTION

However, since a vibration sensor for detecting vibration is integrally attached to one of the plurality of rollers, the vibration generated when the notch of the substrate hits the roller can be detected only once while the substrate rotates once. Therefore, in order to accurately obtain the rotation speed of the substrate on the basis of the vibration generated when the notch of the substrate hits the roller, it is necessary to take a sufficient measurement time. In order to shorten the measurement time, it is conceivable to attach the vibration sensor to each roller, but in this case, a device configuration becomes complicated and the cost increases.

In addition, the vibration sensor needs to be installed in a housing or the like in which vibration is transmitted and installed near a vibration source in consideration of the attenuation of vibration. However, a microphone only needs to be able to detect sound transmitted to the air, so that there are more options of installation places compared with the vibration sensor.

It is desirable to provide a technique capable of accurately obtaining a rotation speed of a substrate without complicating a device configuration in a cleaning device that holds and rotates a peripheral edge part of the substrate by a plurality of rollers.

A cleaning device according to one aspect of the present disclosure includes:
a plurality of rollers that hold a peripheral edge part of a substrate;
a rotation driving unit that rotates the substrate by rotationally driving the plurality of rollers;
a cleaning member that abuts on the substrate and cleans the substrate;
a cleaning liquid supply nozzle that supplies a cleaning liquid to the substrate;
a microphone that detects a sound generated when a notch of the peripheral edge part of the substrate hits the plurality of rollers; and a rotation speed calculation unit that calculates a rotation speed of the substrate on the basis of the sound detected by the microphone.

A polishing device according to one aspect of the present disclosure includes:
a polishing unit that polishes a substrate; and
a cleaning unit that cleans the substrate after polishing.
The cleaning unit has
a plurality of rollers that hold a peripheral edge part of the substrate,
a rotation driving unit that rotates the substrate by rotationally driving the plurality of rollers,
a cleaning member that abuts on the substrate and cleans the substrate,
a cleaning liquid supply nozzle that supplies a cleaning liquid to the substrate,
a microphone that detects a sound generated when a notch of the peripheral edge part of the substrate hits the plurality of rollers, and
a rotation speed calculation unit that calculates a rotation speed of the substrate on the basis of the sound detected by the microphone.

A device according to one aspect of the present disclosure is a device that calculates a rotation speed of a substrate in a cleaning device including
a plurality of rollers that hold a peripheral edge part of the substrate,
a rotation driving unit that rotates the substrate by rotationally driving the plurality of rollers,
a cleaning member that abuts on the substrate and cleans the substrate, and
a cleaning liquid supply nozzle that supplies a cleaning liquid to the substrate.
The device includes:
a microphone that detects a sound generated when a notch of a peripheral edge part of the substrate hits the plurality of rollers; and
a rotation speed calculation unit that calculates the rotation speed of the substrate on the basis of the sound detected by the microphone.

A cleaning method according to one aspect of the present disclosure is a method that calculates a rotation speed of a substrate in a cleaning device including
a plurality of rollers that hold a peripheral edge part of the substrate,
a rotation driving unit that rotates the substrate by rotationally driving the plurality of rollers,
a cleaning member that abuts on the substrate and cleans the substrate, and
a cleaning liquid supply nozzle that supplies a cleaning liquid to the substrate.
The method includes steps of:
detecting, by a microphone, a sound generated when a notch of a peripheral edge part of the substrate hits the plurality of rollers; and
calculating the rotation speed of the substrate on the basis of the sound detected by the microphone.

DESCRIPTION OF EMBODIMENTS

Figure 1:
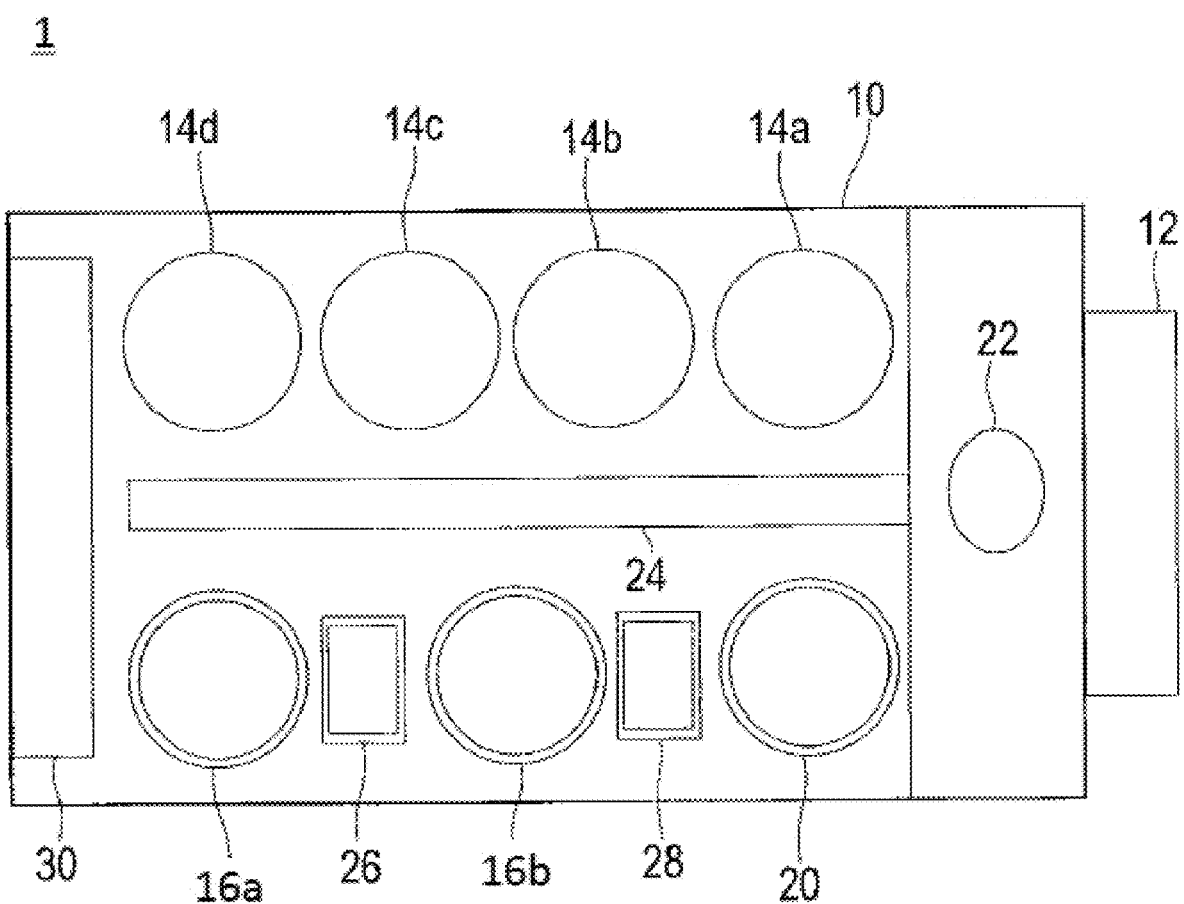
FIG. 1 is a plan view illustrating an overall configuration of a polishing device according to an embodiment.

A cleaning device according to a first aspect of the embodiment includes:

a plurality of rollers that hold a peripheral edge part of a substrate;

a rotation driving unit that rotates the substrate by rotationally driving the plurality of rollers;

a cleaning member that abuts on the substrate and cleans the substrate;

a cleaning liquid supply nozzle that supplies a cleaning liquid to the substrate;

a microphone that detects a sound generated when a notch of the peripheral edge part of the substrate hits the plurality of rollers; and a rotation speed calculation unit that calculates a rotation speed of the substrate on the basis of the sound detected by the microphone.

According to such an aspect, for example, in a case where the number of rollers is N (N is a natural number of 2 or more), the notch passes through the N rollers during one rotation of the substrate, so that the sound generated when the notch hits the rollers can be detected N times by one microphone. Therefore, as compared with a case where the vibration generated when the notch hits the roller is detected by one vibration sensor, the resolution can be increased N times, whereby the rotation speed of the substrate can be accurately obtained in a short time without complicating the device configuration.

A cleaning device according to a second aspect of the embodiment is the cleaning device according to the first aspect.

The cleaning device further includes a housing that defines a cleaning space in which the substrate is cleaned.

The plurality of rollers, the cleaning member, and the cleaning liquid supply nozzle are disposed inside the housing, and at least one microphone is disposed outside the housing.

As a result of actual verification by the present inventors, it has been found that, in a case where the microphone is disposed outside the housing, the detection accuracy of the sound generated when the notch of the substrate hits the roller can be improved as compared with a case where the microphone is disposed inside the housing. Therefore, according to such an aspect, the rotation speed of the substrate can be obtained more accurately. In addition, according to such an aspect, waterproof processing of the microphone is unnecessary, and even in a case where a flammable cleaning liquid is used, explosion prevention processing of the microphone is unnecessary.

A cleaning device according to a third aspect of the embodiment is the cleaning device according to the first aspect.

The cleaning device further includes a housing that defines a cleaning space in which the substrate is cleaned.

The plurality of rollers, the cleaning member, and the cleaning liquid supply nozzle are disposed inside the housing, and the microphone is disposed only inside the housing.

A cleaning device according to a fourth aspect of the embodiment is the cleaning device according to any one of the first to third aspects.

The rotation speed calculation unit calculates a rotation speed of the substrate on the basis of a fundamental wave and a harmonic of the sound.

In a case where the frequency of the sound fluctuates, the fluctuation amount of the peak waveform becomes larger for the higher harmonics (for example, a fluctuation amount of 1% of the fundamental wave of 100 Hz is 1 Hz, but a fluctuation amount of 1% of the second harmonic of 200 Hz is 2 Hz, which is twice the fluctuation amount of the fundamental wave). Therefore, according to such an aspect, the rotation speed of the substrate can be obtained more accurately by calculating the rotation speed of the substrate using not only the fundamental wave of the sound but also the harmonic.

A cleaning device according to a fifth aspect of the embodiment is the cleaning device according to any one of the first to fourth aspects.

The cleaning device further includes a vibration sensor that detects a vibration generated when the notch of the peripheral edge part of the substrate hits one of the plurality of rollers.

The rotation speed calculation unit calculates the rotation speed of the substrate on the basis of the sound detected by the microphone and the vibration detected by the vibration sensor.

A cleaning device according to a sixth aspect of the embodiment is the cleaning device according to any one of the first to fourth aspects.

The cleaning device further includes a second microphone that detects a sound generated from the rotation driving unit.

The rotation speed calculation unit calculates the rotation speed of the substrate on the basis of the sound detected by the microphone and the sound detected by the second microphone.

A cleaning device according to a seventh aspect of the embodiment is the cleaning device according to any one of the first to sixth aspects.

The cleaning device further includes a rotation speed setting unit that sets a set value of the rotation speed of the substrate in the rotation driving unit.

The rotation speed calculation unit calculates the rotation speed of the substrate in consideration of the set value acquired from the rotation speed setting unit.

A cleaning device according to an eighth aspect of the embodiment is the cleaning device according to any one of the first to seventh aspects.

The cleaning device further includes a display control unit that controls a display to display the rotation speed calculated by the rotation speed calculation unit.

A cleaning device according to a ninth aspect of the embodiment is the cleaning device according to the eighth aspect.

The display control unit averages a plurality of past rotation speeds calculated by the rotation speed calculation unit and controls the display to display the average.

A cleaning device according to a tenth aspect of the embodiment is the cleaning device according to any one of the first to ninth aspects.

The cleaning device further includes an abnormality determination unit that determines a presence or absence of an abnormality on the basis of the rotation speed calculated by the rotation speed calculation unit.

A cleaning device according to an eleventh aspect of the embodiment is the cleaning device according to the tenth aspect.

The abnormality determination unit determines the presence or absence of the abnormality on the basis of an average value of the plurality of past rotation speeds calculated by the rotation speed calculation unit.

A cleaning device according to a twelfth aspect of the embodiment is the cleaning device according to the tenth or eleventh aspect.

The cleaning device further includes an abnormality reporting unit that reports the abnormality and/or instructs the rotation driving unit to stop in a case where the abnormality determination unit determines that there is the abnormality.

A cleaning device according to a thirteenth aspect of the embodiment is the cleaning device according to any one of the tenth to twelfth aspects.

The abnormality determination unit calculates a difference or a ratio between the rotation speed calculated by the rotation speed calculation unit and the set value acquired from the rotation speed setting unit, and determines that there is the abnormality in a case where the difference or the ratio exceeds a predetermined threshold.

A cleaning device according to a fourteenth aspect of the embodiment is the cleaning device according to any one of the tenth to thirteenth aspects.

The abnormality determination unit determines that there is the abnormality in a case where the rotation speed calculated by the rotation speed calculation unit is zero and the set value acquired from the rotation speed setting unit is not zero or in a case where an abnormal sound is detected by the microphone.

A cleaning device according to a fifteenth aspect of the embodiment is the cleaning device according to any one of the tenth to fourteenth aspects.

The abnormality determination unit determines the presence or absence of the abnormality in consideration of a fluctuation of a current flowing through a motor that rotates the cleaning member.

A cleaning device according to a sixteenth aspect of the embodiment is the cleaning device according to any one of the tenth to fifteenth aspects.

The abnormality determination unit determines the presence or absence of the abnormality in consideration of a fluctuation of an internal air pressure of the housing.

A cleaning device according to a seventeenth aspect of the embodiment is the cleaning device according to the second aspect.

The microphone collects a sound generated inside the housing from a ventilation gap provided in the housing.

A cleaning device according to an eighteenth aspect of the embodiment is the cleaning device according to the seventh aspect.

The rotation speed calculation unit changes a cutoff frequency of a filter applied to a signal of the sound according to the set value.

A polishing device according to a nineteenth aspect of the embodiment includes:

a polishing unit that polishes a substrate; and a cleaning unit that cleans the substrate after polishing.

The cleaning unit has a plurality of rollers that hold a peripheral edge part of the substrate, a rotation driving unit that rotates the substrate by rotationally driving the plurality of rollers, a cleaning member that abuts on the substrate and cleans the substrate, a cleaning liquid supply nozzle that supplies a cleaning liquid to the substrate, a microphone that detects a sound generated when a notch of the peripheral edge part of the substrate hits the plurality of rollers, and a rotation speed calculation unit that calculates a rotation speed of the substrate on the basis of the sound detected by the microphone.

A device according to a twentieth aspect of the embodiment is a device that calculates a rotation speed of a substrate in a cleaning device including a plurality of rollers that hold a peripheral edge part of the substrate, a rotation driving unit that rotates the substrate by rotationally driving the plurality of rollers, a cleaning member that abuts on the substrate and cleans the substrate, and a cleaning liquid supply nozzle that supplies a cleaning liquid to the substrate.

The device includes:

a microphone that detects a sound generated when a notch of a peripheral edge part of the substrate hits the plurality of rollers; and a rotation speed calculation unit that calculates the rotation speed of the substrate on the basis of the sound detected by the microphone.

A cleaning method according to a twenty-first aspect of the embodiment is a method that calculates a rotation speed of a substrate in a cleaning device including a plurality of rollers that hold a peripheral edge part of the substrate, a rotation driving unit that rotates the substrate by rotationally driving the plurality of rollers, a cleaning member that abuts on the substrate and cleans the substrate, and a cleaning liquid supply nozzle that supplies a cleaning liquid to the substrate.

The method includes steps of:

detecting, by a microphone, a sound generated when a notch of a peripheral edge part of the substrate hits the plurality of rollers; and calculating the rotation speed of the substrate on the basis of the sound detected by the microphone.

Specific examples of the embodiment will be described in detail below with reference to the accompanying drawings. Incidentally, in the following description and the drawings used in the following description, the same reference numerals are used for the part which can be configured identically, and duplicate description is omitted.

<Substrate Processing Device>

FIG. 1 is a plan view illustrating an overall configuration of a substrate processing device (also referred to as a polishing device) 1 according to the embodiment.

As illustrated in FIG. 1, the substrate processing device 1 includes a housing 10 having a substantially rectangular shape, and a load port 12 on which a substrate cassette (not illustrated) for stocking a plurality of substrates W (see FIG. 2 and the like) is placed. The load port 12 is disposed adjacent to the housing 10. An open cassette, a standard manufacturing interface (SMIF) pod, or a front opening unified pod (FOUP) can be mounted on the load port 12. The SMIF pod and the FOUP are airtight containers capable of maintaining an environment independent of an external space by housing the substrate cassette therein and covering the substrate cassette with a partition wall. Examples of a substrate W include a semiconductor wafer.

A plurality of (four in the aspect illustrated in FIG. 1) polishing units 14a to 14d, a first cleaning unit 16a and a second cleaning unit 16b for cleaning the substrate W after polishing, and a drying unit 20 for drying the substrate W after cleaning are housed in the housing 10. The polishing units 14a to 14d are arranged along the longitudinal direction of the housing 10, and the cleaning units 16a and 16b and the drying unit 20 are also arranged along the longitudinal direction of the housing 10.

A first transfer robot 22 is disposed in an area surrounded by the load port 12, the polishing unit 14a positioned on the load port 12 side, and the drying unit 20. In addition, a transfer unit 24 is disposed in parallel with the longitudinal direction of the housing 10 between an area where the polishing units 14a to 14d are arranged and an area where the cleaning units 16a and 16b and the drying unit 20 are arranged. The first transfer robot 22 receives the substrate W before polishing from the load port 12 and delivers the substrate to the transfer unit 24, and receives the dried substrate W taken out from the drying unit 20 from the transfer unit 24.

A second transfer robot 26 that delivers the substrate W between the first cleaning unit 16a and the second cleaning unit 16b is disposed between the first cleaning unit 16a and the second cleaning unit 16b. A third transfer robot 28 that delivers the substrate W between the second cleaning unit 16b and the drying unit 20 is disposed between the second cleaning unit 16b and the drying unit 20.

The substrate processing device 1 is provided with a polishing control device 30 that controls the movement of each of the units 14a to 14d, 16a, 16b, 22, 24, 26, and 28. As the polishing control device 30, for example, a programmable logic controller (PLC) is used. In the aspect illustrated in FIG. 1, the polishing control device 30 is disposed inside the housing 10, but the present invention is not limited thereto, and the polishing control device 30 may be disposed outside the housing 10.

As the first cleaning unit 16a and/or the second cleaning unit 16b, a roll cleaning device (a cleaning device 16 according to the embodiment to be described later) may be used which brings a roll cleaning member linearly extending over substantially the entire length of the diameter of the substrate W into contact with the surface of the substrate W and scrubs and cleans the surface of the substrate W while rotating the roll cleaning member in the presence of the cleaning liquid, a pencil cleaning device (not illustrated) may be used which brings a columnar pencil cleaning member extending in a vertical direction into contact with the surface of the substrate W and moves the pencil cleaning member in one direction parallel to the surface of the substrate W while rotating the pencil cleaning member to scrub and clean the surface of the substrate W in the presence of the cleaning liquid, a buff cleaning/polishing device (not illustrated) may be used which brings a buff cleaning/polishing member having a rotation axis extending in the vertical direction into contact with the surface of the substrate W and moves the buff cleaning/polishing member in one direction parallel to the surface of the substrate W while rotating the buff cleaning/polishing member to scrub, clean, and polish the surface of the substrate W in the presence of the cleaning liquid, or a two-fluid jet cleaning device (not illustrated) may be used which cleans the surface of the substrate W by a two-fluid jet. Further, as the first cleaning unit 16a and/or the second cleaning unit 16b, any two or more of the roll cleaning device, the pencil cleaning device, the buff cleaning/polishing device, and the two-fluid jet cleaning device may be used in combination.

The cleaning liquid includes a rinse liquid such as pure water (DIW) and a chemical liquid such as ammonia hydrogen peroxide (SC1), hydrochloric acid hydrogen peroxide (SC2), sulfuric acid hydrogen peroxide (SPM), sulfuric acid water addition, or hydrofluoric acid. In the present embodiment, the cleaning liquid means either the rinse liquid or the chemical liquid unless otherwise specified.

As the drying unit 20, a spin dryer may be used which sprays isopropyl alcohol (IPA) vapor from a spray nozzle moving in one direction parallel to the surface of the substrate W toward the rotating substrate W to dry the substrate W, and further rotates the substrate W at a high speed to dry the substrate W by a centrifugal force.

<Cleaning Device>

Figure 2:
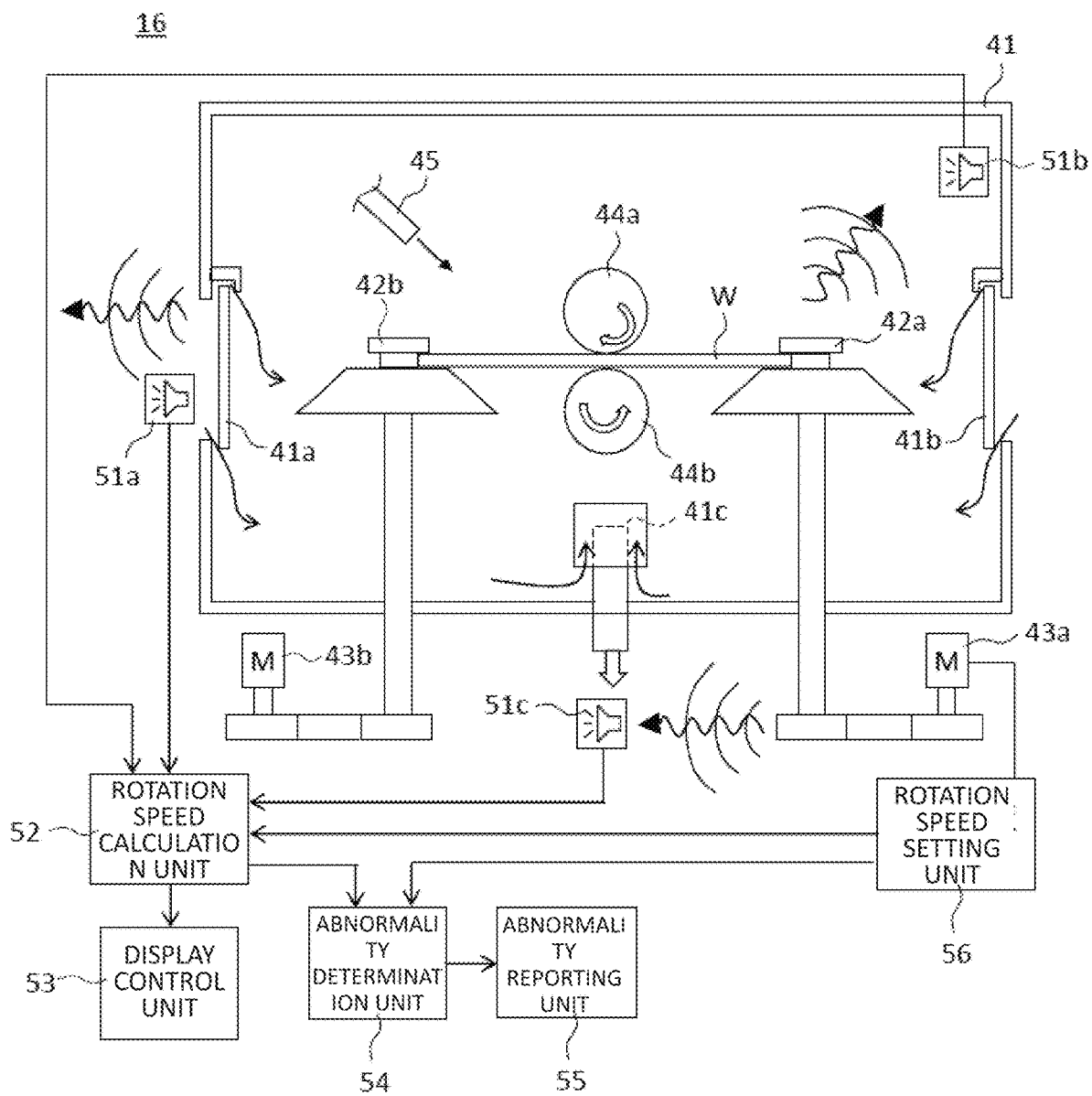
FIG. 2 is a side view illustrating an internal configuration of a cleaning device according to the embodiment.
Figure 3:
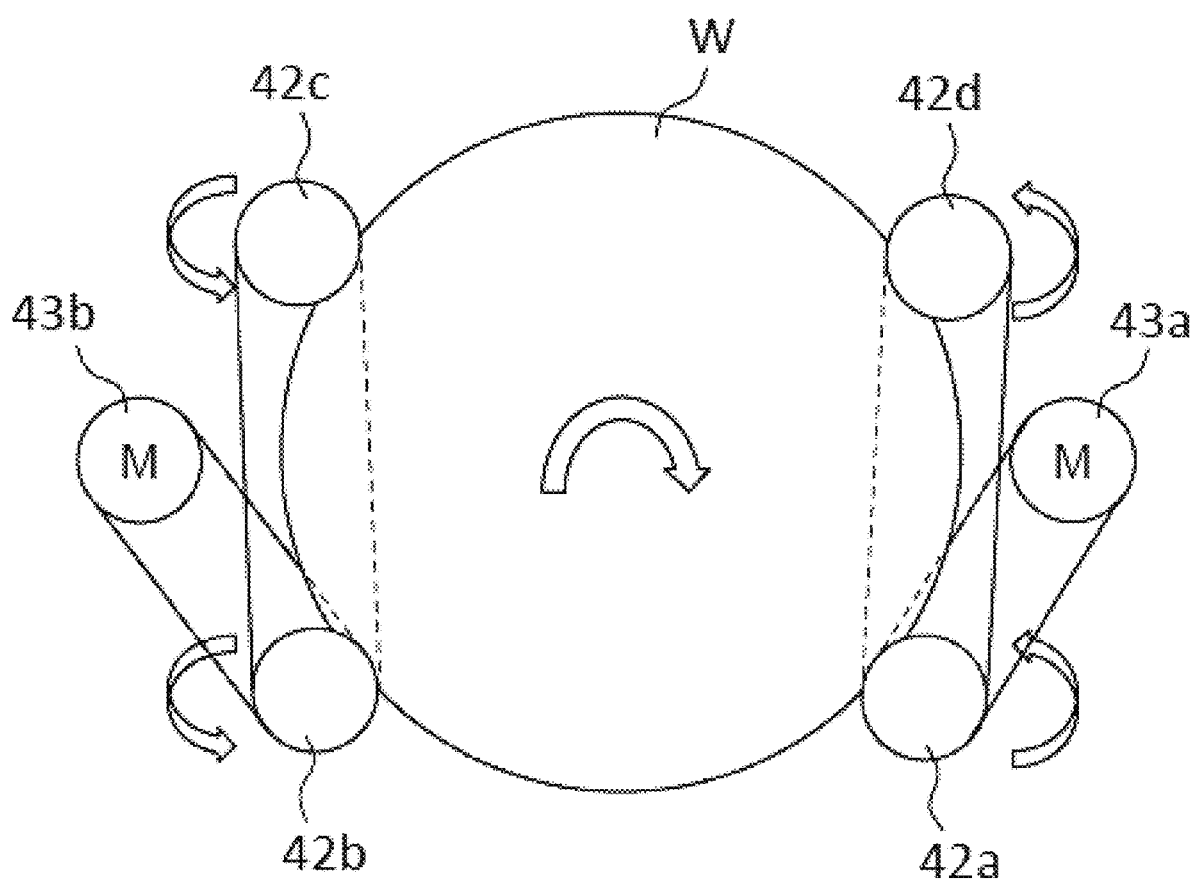
FIG. 3 is a plan view illustrating arrangement of rollers in the cleaning device illustrated in FIG. 2.

Next, the cleaning device 16 according to the embodiment will be described. FIG. 2 is a side view illustrating the internal configuration of the cleaning device 16 according to the embodiment, and FIG. 3 is a plan view illustrating the arrangement of rollers 42a to 42d in the cleaning device 16. The cleaning device 16 according to the embodiment may be used as the first cleaning unit 16a and/or the second cleaning unit 16b in the substrate processing device 1 described above.

As illustrated in FIGS. 2 and 3, the cleaning device 16 includes a housing 41 that defines a cleaning space in which the substrate W is cleaned, a plurality of (four in the illustrated example) rollers 42a to 42d that hold the peripheral edge part of the substrate W, rotation driving units 43a and 43b that rotate the substrate W by rotationally driving the plurality of rollers 42a to 42d, cleaning members 44a and 44b that abut on the substrate W to clean the substrate W, and a cleaning liquid supply nozzle 45 that supplies a cleaning liquid to the substrate W.

In the present embodiment, the rotation driving units 43a and 43b each include a motor. In the illustrated example, the motor of the rotation driving unit denoted by reference numeral 43a rotationally drives the rollers denoted by reference numerals 42a and 42d via a pulley and a belt, and the motor of the rotation driving unit denoted by reference numeral 43b rotationally drives the rollers denoted by reference numerals 42b and 42c via a pulley and a belt. When the plurality of rollers 42a to 42d are rotationally driven in the same direction (counterclockwise in the example illustrated in FIG. 3) by the rotation driving units 43a and 43b, the substrate W held by the plurality of rollers 42a to 42d is rotated in a direction (clockwise in the example illustrated in FIG. 3) opposite to the rotation direction of the rollers 42a to 42d by the frictional force acting between each of the rollers 42a to 42d and the peripheral edge part of the substrate W.

In the present embodiment, the cleaning members 44a and 44b are roll cleaning members (roll sponges) extending in a columnar shape and an elongated shape and made of, for example, polyvinyl alcohol (PVA), but are not limited thereto, and may be a columnar pencil cleaning member extending in the vertical direction, or may be a buff cleaning/polishing member having a rotation axis extending in the vertical direction.

As illustrated in FIG. 2, the plurality of rollers 42a to 42d, the cleaning members 44a and 44b, and the cleaning liquid supply nozzle 45 are disposed inside the housing 41, and the cleaning liquid supplied onto the substrate W is prevented from scattering to the outside of the cleaning space.

In the example illustrated in FIG. 2, an opening (substrate loading/unloading port) for loading or unloading the substrate W is formed in a side wall of the housing 41, and the substrate loading/unloading port can be opened/closed by shutters 41a and 41b. Further, an exhaust port 41c is formed at the bottom of the housing 41. The air inside the housing 41 is discharged from the exhaust port 41c, and the air outside the housing 41 flows in through a gap between the substrate loading/unloading port and the shutters 41a and 41b, thereby ventilating the cleaning space.

As illustrated in FIG. 2, the cleaning device 16 according to the present embodiment includes microphones 51a and 51b that detect the sound generated when a notch (not illustrated) in the peripheral edge part of the substrate W hits the plurality of rollers 42a to 42d, and a rotation speed calculation unit 52 that calculates the rotation speed of the substrate W on the basis of the sound detected by the microphones 51a and 51b.

The microphones 51a and 51b may be disposed at any position inside the housing 10 of the substrate processing device 1 as long as the microphones can detect the sound. Further, the microphones 51a and 51b may be disposed outside the housing 41 or may be disposed inside the housing 41. In the example illustrated in FIG. 2, the microphone denoted by reference numeral 51a is disposed outside the housing 41, and the microphone denoted by reference numeral 51b is disposed inside the housing 41. That is, in the example illustrated in FIG. 2, at least one microphone is disposed outside the housing 41. Note that, although not illustrated, the microphone may be disposed only inside the housing 41.

As a result of actual verification by the present inventors, it has been found that, in a case where the microphone 51a is disposed outside the housing 41, the detection accuracy of the sound generated when the notch of the substrate W hits the rollers 42a to 42d can be improved as compared with a case where the microphone 51b is disposed inside the housing. The present inventors have studied the reason for this, and it is presumed that the reason is as follows. That is, as a loud sound generated inside the housing 41 during the cleaning of the substrate W, there is the sound (splashing sound) of the cleaning liquid flowing, but since this sound is a sound transmitted by the vibration of the air, the sound is blocked by the housing 41 surrounding the cleaning space, and is greatly attenuated outside the housing 41 (there is reverberation on the inner surface of the housing 41 inside the housing 41). On the other hand, the sound generated when the notch of the substrate W hits the rollers 42a to 42d includes the solid propagation sound transmitted by the vibration of the hard member, and thus even when the cleaning space is surrounded by the housing 41, the sound can be transmitted to the outside of the housing 41 through the housing 41 itself. Therefore, in a case where the microphone 51a is disposed outside the housing 41, as compared with a case where the microphone 51b is arranged inside the housing, the influence of the sound (splashing sound) of the cleaning liquid flowing is greatly reduced and the S/N ratio is improved, so that it is possible to improve the detection accuracy of the sound generated when the notch of the substrate W hits the rollers 42a to 42d.

In a case where the microphone 51a is disposed outside the housing 41, there is an advantage that waterproof processing of the microphone 51a is unnecessary, and even in a case where a flammable cleaning liquid is used, explosion prevention processing of the microphone 51a is unnecessary.

In a case where the microphone 51a is disposed outside the housing 41, the microphone 51a may collect the sound generated inside the housing 41 from a gap for ventilation (intake) provided in the housing 41. In the example illustrated in FIG. 2, the microphone 51a is disposed adjacent to the substrate loading/unloading port outside the housing 41, and can collect sound generated inside the housing 41 from the gap between the substrate loading/unloading port and the shutter 41a.

In a case where the microphone 51b is disposed inside the housing 41, it is desirable to perform waterproof processing such as covering the microphone 51b with a plastic bag (not illustrated).

Figure 5:
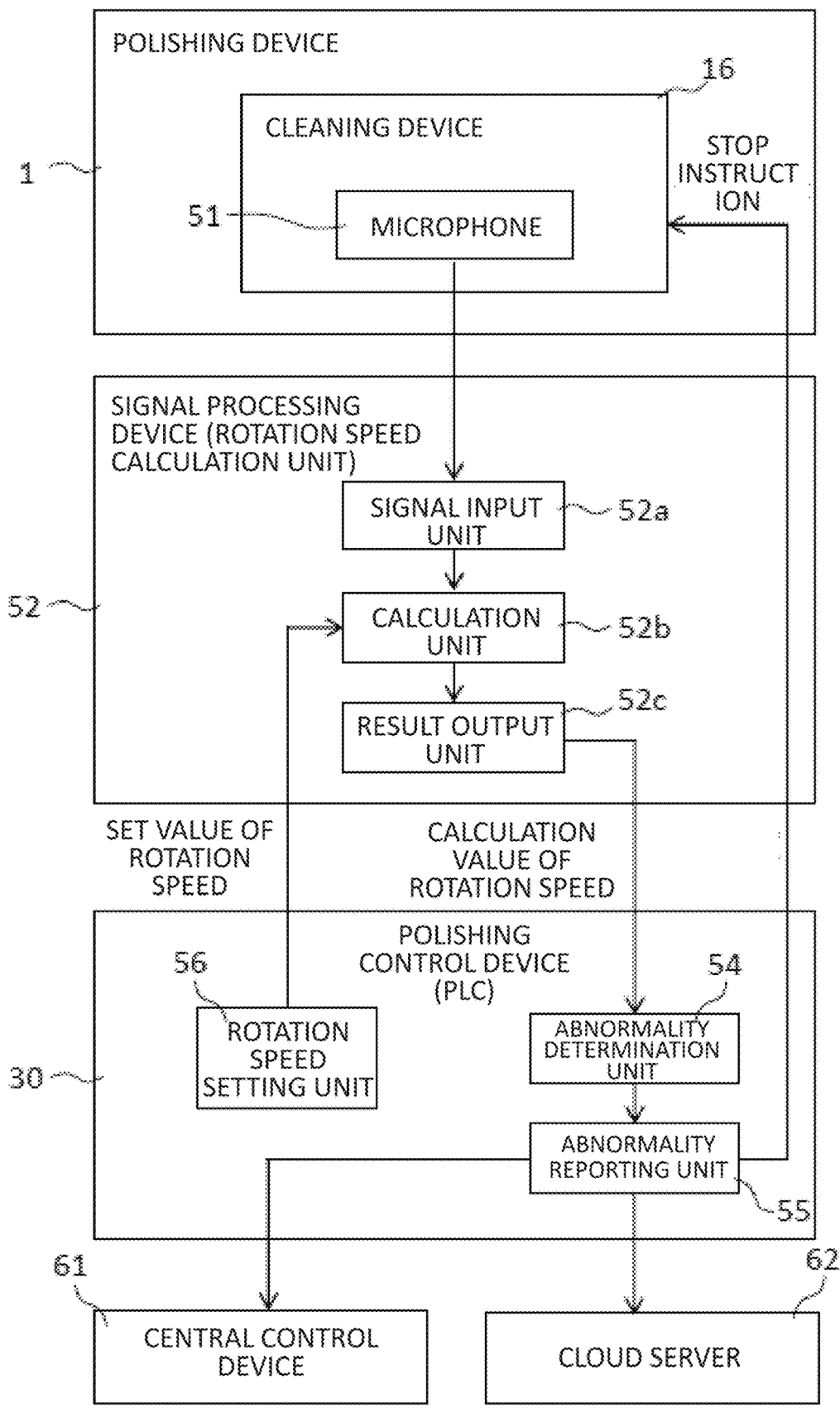
FIG. 5 is a block diagram illustrating a configuration for calculating the rotation speed of the substrate on the basis of the sound detected by the microphone.

FIG. 5 is a block diagram illustrating a configuration for calculating the rotation speed (also referred to as an actual rotation speed) of the substrate W on the basis of the sound detected by the microphones 51a and 51b.

As illustrated in FIG. 5, the rotation speed calculation unit 52 includes a signal input unit 52a, a calculation unit 52b, and a result output unit 52c, and calculates the rotation speed (actual rotation speed) of the substrate W on the basis of the sound detected by the microphones 51a and 51b. Here, the rotation speed calculation unit 52 may calculate the rotation speed of the substrate W on the basis of the fundamental wave of the sound detected by the microphones 51a and 51b, or may calculate the rotation speed of the substrate W on the basis of the fundamental wave and harmonic of the sound detected by the microphones 51a and 51b.

Figure 4:
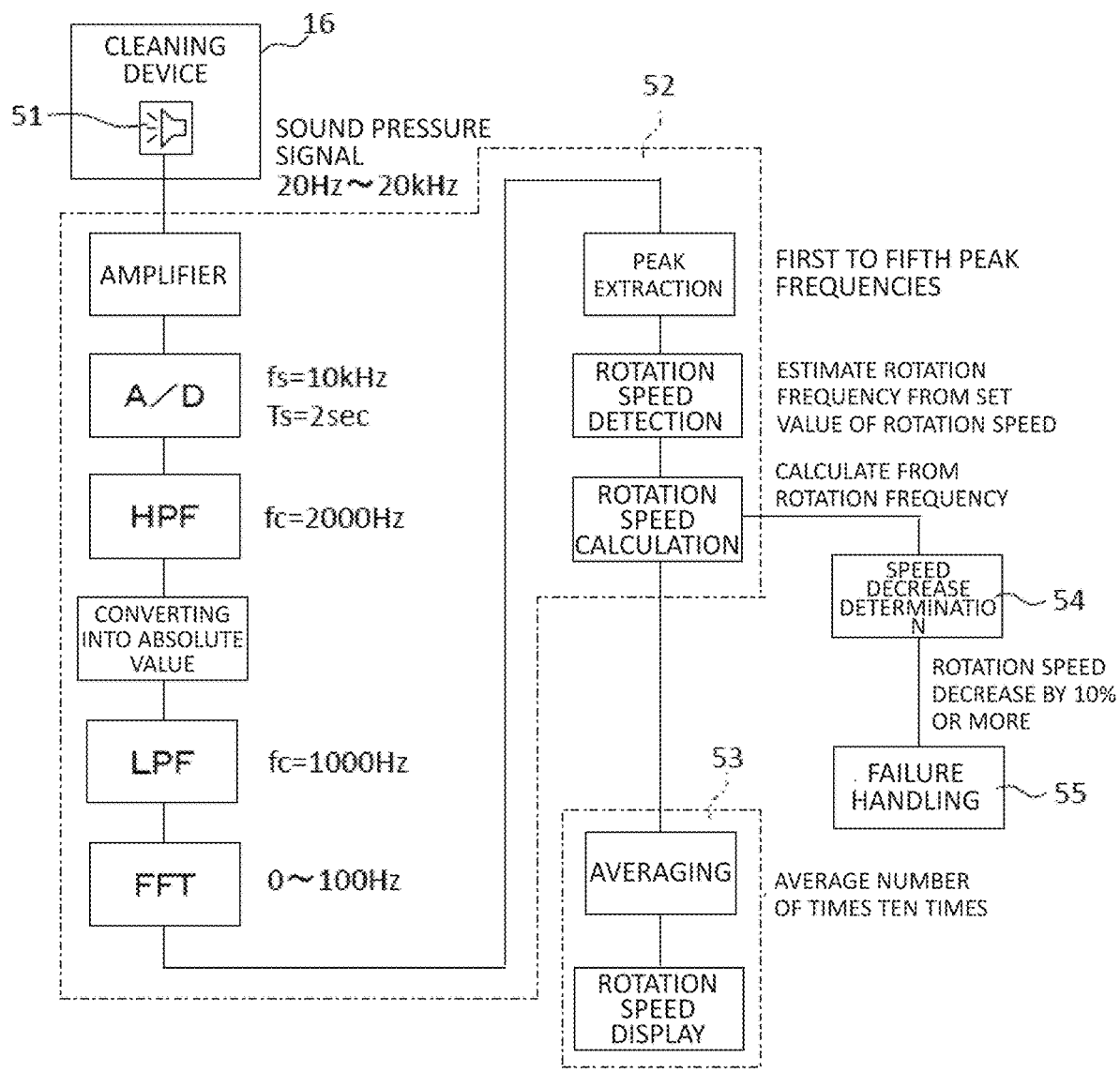
FIG. 4 is a diagram illustrating an example of a flow of signal processing of calculating a rotation speed of a substrate on the basis of a sound detected by a microphone.

FIG. 4 is a diagram illustrating an example of a flow of signal processing for calculating the rotation speed (actual rotation speed) of the substrate W on the basis of the sound detected by the microphones 51a and 51b.

Figure 6:
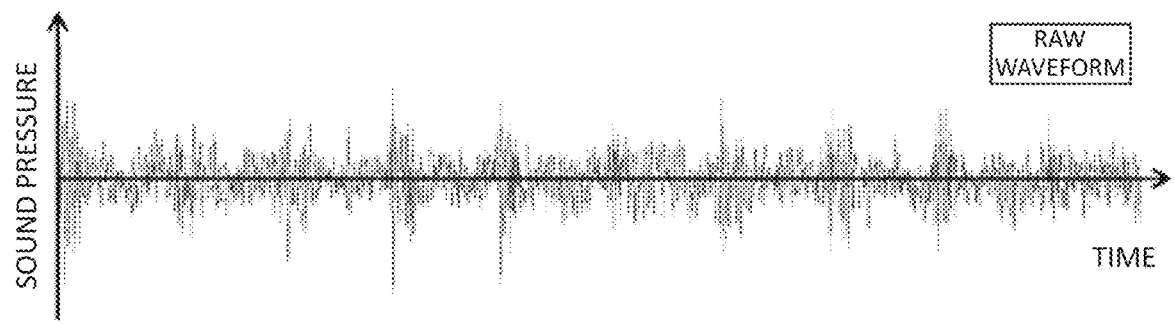
FIG. 6 is an example of a graph illustrating a raw waveform of a signal of the sound detected by the microphone in a normal state.
Figure 7:
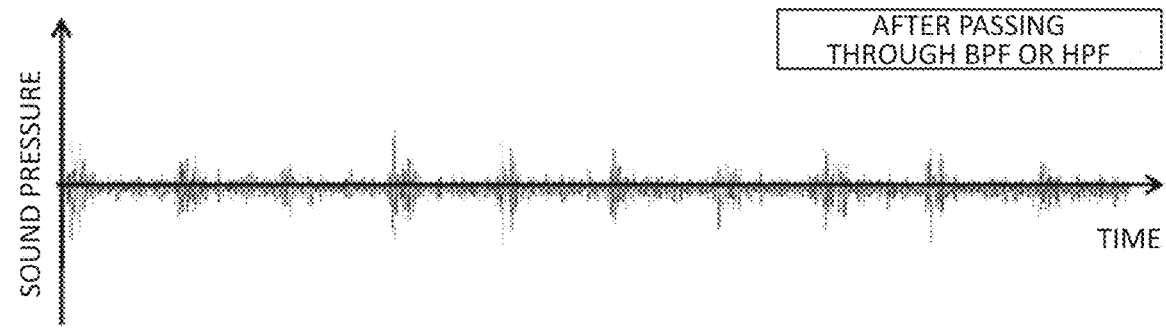
FIG. 7 is an example of a graph illustrating a waveform of the signal of the sound detected by the microphone in the normal state after passing through a BPF or an HPF.
Figure 11:
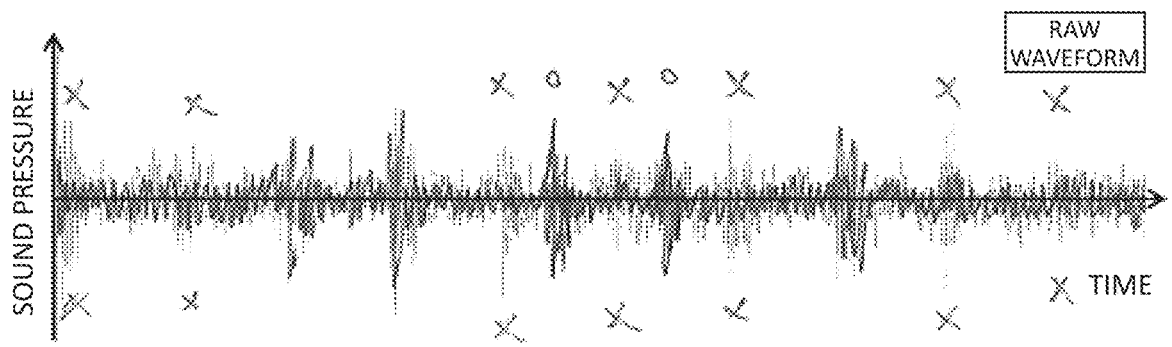
FIG. 11 is an example of a graph illustrating raw waveforms of the signal of the sound detected by the microphone in the normal state and an abnormal state in an overlapping manner.
Figure 12:
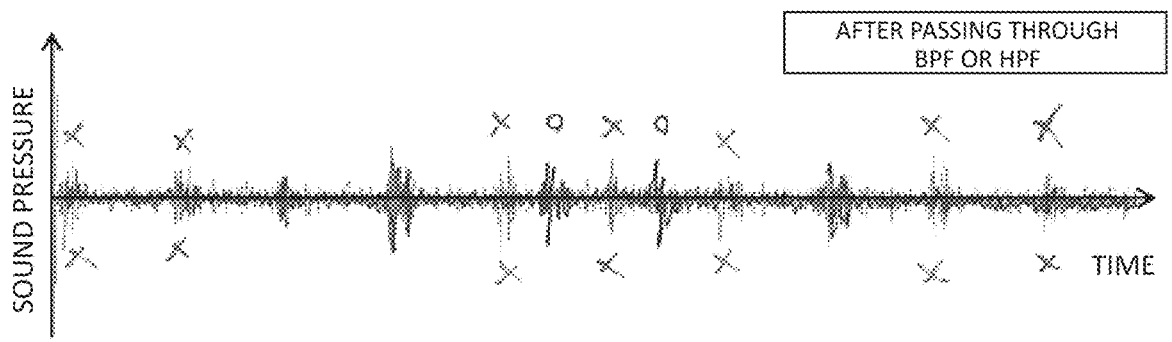
FIG. 12 is an example of a graph illustrating waveforms of the signal of the sound detected by the microphone in the normal state and the abnormal state after passing through the BPF or the HPF in an overlapping manner.

As illustrated in FIG. 4, the rotation speed calculation unit 52 first amplifies the signal (sound pressure) of the sound detected by the microphones 51a and 51b by an amplifier, then performs analog-digital (A/D) conversion, and then passes the signal through a band-pass filter (BPF) or a high-pass filter (HPF). As an example, a sampling frequency fs of the A/D conversion is 10 kHz, a sampling period Ts is 2 sec, and a cutoff frequency fc of the HPF is 2000 Hz. FIG. 6 is an example of a graph illustrating a raw waveform (that is, a waveform before passing through the BPF or the HPF) of the signal of the sound detected by the microphones 51a and 51b in a normal state, and FIG. 7 is an example of a graph illustrating a waveform of the signal of the sound detected by the microphones 51a and 51b in the normal state after passing through the BPF or the HPF. In addition, FIG. 11 is an example of a graph illustrating a raw waveform of the signal of the sound detected by the microphone in an abnormal state in superposition with the raw waveform of the signal of the sound detected by the microphone in the normal state, and FIG. 12 is an example of a graph illustrating a waveform of the signal of the sound detected by the microphone in the abnormal state after passing through the BPF or the HPF in superposition with the waveform of the signal of the sound detected by the microphone in the normal state after passing through the BPF or the HPF. In FIGS. 11 and 12, "x" indicates a part where a peak in the normal state disappears in the abnormal state, and "o" indicates a part where a peak is not present in the normal state but added in the abnormal state.

Figure 8:
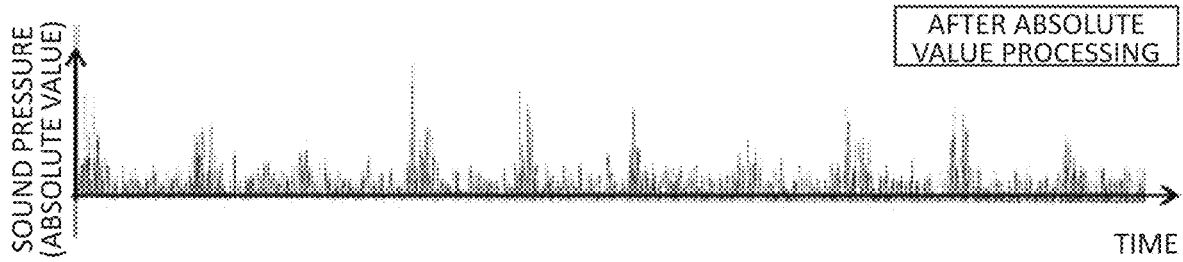
FIG. 8 is an example of a graph illustrating a waveform of the signal of the sound detected by the microphone in the normal state after absolute value processing.
Figure 9:
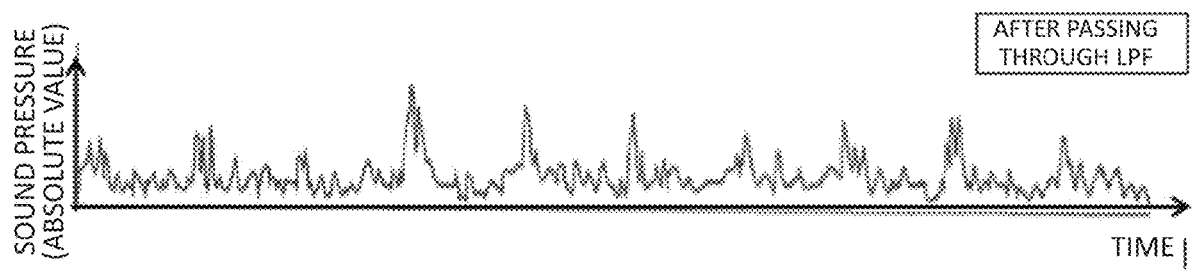
FIG. 9 is an example of a graph illustrating a waveform of the signal of the sound detected by the microphone in the normal state after passing through an LPF.
Figure 13:
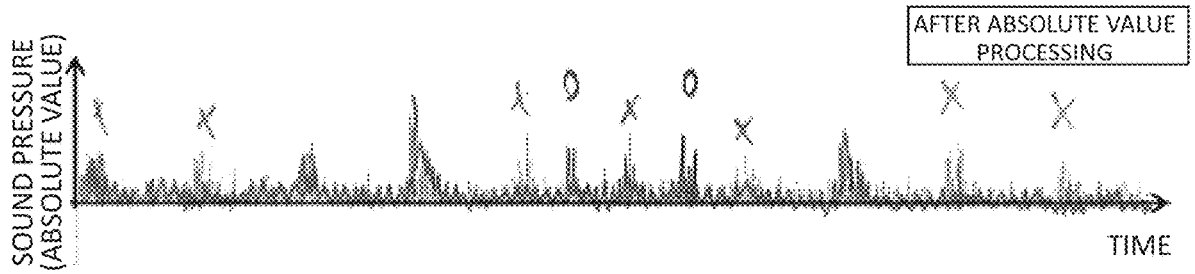
FIG. 13 is an example of a graph illustrating waveforms of the signal of the sound detected by the microphone in the normal state and the abnormal state after the absolute value processing in an overlapping manner.
Figure 14:
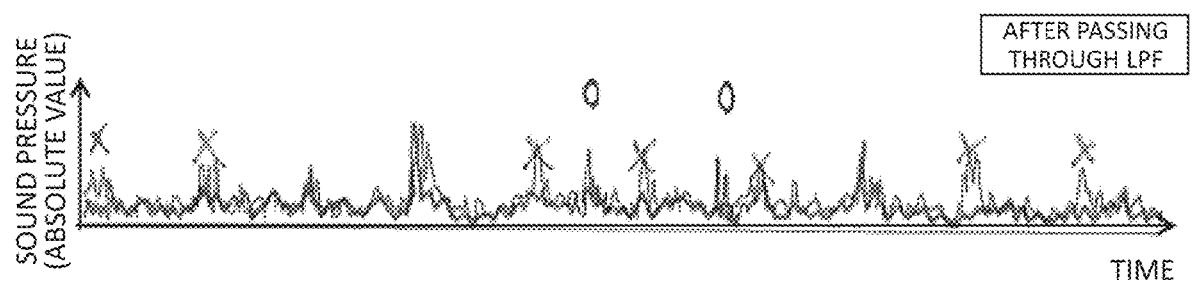
FIG. 14 is an example of a graph illustrating waveforms of the signal of the sound detected by the microphone in the normal state and the abnormal state after passing through the LPF in an overlapping manner.

Next, the rotation speed calculation unit 52 performs envelope processing by converting the signal that has passed through the HPF into an absolute value and then causing the signal to pass through the low-pass filter (LPF). As an example, the cutoff frequency fc of the LPF is 1000 Hz. FIG. 8 is an example of a graph illustrating a waveform of the signal of the sound detected by the microphones 51a and 51b in the normal state after absolute value processing, and FIG. 9 is an example of a graph illustrating a waveform of the signal of the sound detected by the microphones 51a and 51b in the normal state after passing through the LPF. In addition, FIG. 13 is an example of a graph illustrating a waveform of the signal of the sound detected by the microphone in the abnormal state after the absolute value processing in superposition with the waveform of the signal of the sound detected by the microphone in the normal state after the absolute value processing, and FIG. 14 is an example of a graph illustrating a waveform of the signal of the sound detected by the microphone in the abnormal state after passing through the LPF in superposition with the waveform of the signal of the sound detected by the microphone in the normal state after passing through the LPF. In FIGS. 13 and 14, "x" indicates a part where a peak in the normal state disappears in the abnormal state, and "o" indicates a part where a peak is not present in the normal state but added in the abnormal state.

Figure 10:
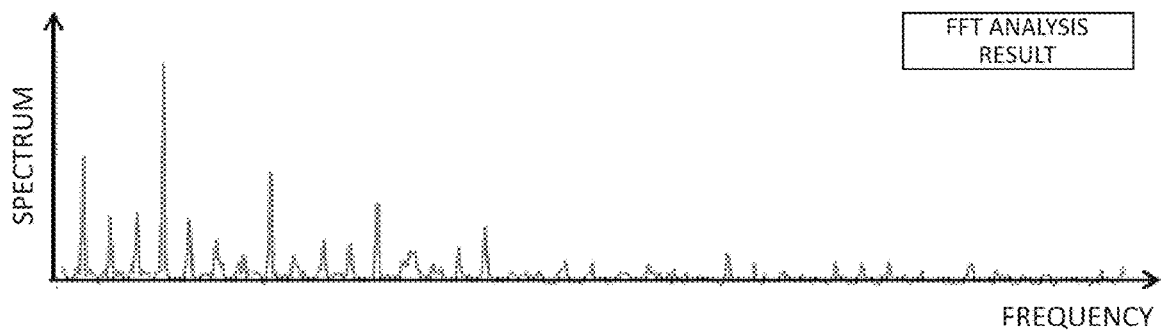
FIG. 10 is an example of a graph illustrating an FFT analysis result of the signal of the sound detected by the microphone in the normal state.
Figure 15:
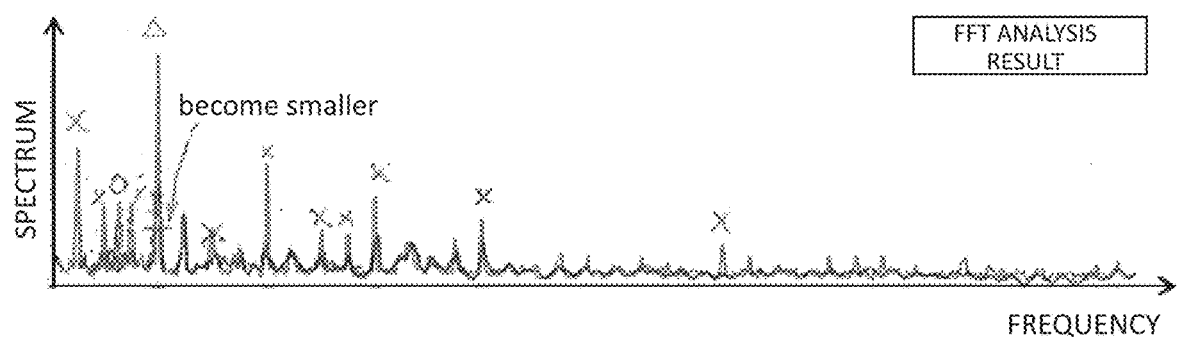
FIG. 15 is an example of a graph illustrating the FFT analysis result of the signal of the sound detected by the microphone in the normal state and the abnormal state in an overlapping manner.

Next, the rotation speed calculation unit 52 performs fast Fourier transform (FFT) at, for example, 0 to 100 Hz on the signal that has passed through the LPF to generate a frequency spectrum. The rotation speed calculation unit 52 may generate the frequency spectrum by averaging a plurality of times of the past FFT analysis results. When averaging is not performed, the calculation can be performed in a shorter time. FIG. 10 is an example of a graph illustrating the FFT analysis result of the signal of the sound detected by the microphones 51a and 51b in the normal state. In addition, FIG. 15 is a graph illustrating an FFT analysis result of the signal of the sound detected by the microphone in the abnormal state in superposition with the FFT analysis result of the signal of the sound detected by the microphone in the normal state. In FIG. 15, "x" indicates a part where a peak in the normal state disappears in the abnormal state, and "o" indicates a part where a peak is not present in the normal state but added in the abnormal state. Referring to FIG. 15, when the FFT analysis result of the normal state and the FFT analysis result of the abnormal state are compared, the frequency (position coordinates on a horizontal axis) of the peak ("o") in the abnormal state is smaller than the frequency (position coordinates) of the peak ("Δ") in the normal state, and from this, it can be seen that the rotation speed of the substrate W in the abnormal state is lower than that in the normal state.

Next, the rotation speed calculation unit 52 extracts (for example, extracts first to fifth peak frequencies) a peak from the generated frequency spectrum (FFT analysis result), estimates the rotational frequency of the substrate W on the basis of the extracted peak frequency and a set value (also referred to as a set rotation speed) of the rotation speed of the substrate W acquired from a rotation speed setting unit 56 described later, and calculates the rotation speed (actual rotation speed) of the substrate W from the estimated rotational frequency T.

The rotation speed calculation unit 52 may change the cutoff frequency fc of the filter (that is, the BPF, the HPF, or the LPF) applied to the signal of the sound detected by the microphones 51a and 51b according to the set value (set rotation speed) of the rotation speed of the substrate W acquired from the rotation speed setting unit 56.

The rotation speed calculation unit 52 may change the cutoff frequency fc of the filter (that is, the BPF, the HPF, or the LPF) applied to the signal of the sound detected by the microphones 51a and 51b according to the type (for example, a chemical liquid, a detergent, water, and the like) of the cleaning liquid and the eigenvalue of the structure (for example, the rollers 42a to 42d).

As one modification, the cleaning device 16 may be provided with a vibration sensor (not illustrated) that detects the vibration generated when the notch of the peripheral edge part of the substrate W hits one roller of the plurality of rollers 42a to 42d, and the rotation speed calculation unit 52 may calculate the rotation speed of the substrate W on the basis of the sound detected by the microphones 51a and 51b and the vibration detected by the vibration sensor (not illustrated). The vibration sensor may be disposed at any position inside the housing 10 of the substrate processing device 1 as long as the vibration sensor can detect the vibration. Further, the vibration sensor may be disposed inside the housing 41 of the cleaning device 16, or may be disposed on an outer plate, a bottom plate, a support, or the like of the housing 41 which is outside the housing 41.

As another modification, the cleaning device 16 may be provided with a second microphone 51c (see FIG. 2) that detects the sound generated from the rotation driving units 43a and 43b, and the rotation speed calculation unit 52 may calculate the rotation speed of the substrate W on the basis of the sound detected by the microphones 51a and 51b and the sound detected by the second microphone 51c.

As illustrated in FIG. 2, the cleaning device 16 according to the present embodiment is further provided with the rotation speed setting unit 56, a display control unit 53, an abnormality determination unit 54, and an abnormality reporting unit 55.

The rotation speed setting unit 56 sets the set value (set rotation speed) of the rotation speed of the substrate W in the rotation driving units 43a and 43b. As described above, the rotation speed calculation unit 52 may calculate the rotation speed (actual rotation speed) of the substrate W in consideration of the set value (set rotation speed) of the rotation speed of the substrate W acquired from the rotation speed setting unit 56. The rotation speed setting unit 56 may be provided in the polishing control device 30 (see FIG. 1).

The display control unit 53 controls a display (not illustrated) to display the rotation speed calculated by the rotation speed calculation unit 52. The display control unit 53 may control the display to display the latest rotation speed calculated by the rotation speed calculation unit 52, or may average a plurality of times (for example, ten times) of the past rotation speeds calculated by the rotation speed calculation unit 52 to control the display to display an average value.

The abnormality determination unit 54 determines the presence or absence of an abnormality on the basis of the rotation speed calculated by the rotation speed calculation unit 52. Here, the abnormality determination unit 54 may determine the presence or absence of an abnormality on the basis of the average value of the plurality of times (for example, ten times) of the past rotation speeds calculated by the rotation speed calculation unit 52. The abnormality determined by the abnormality determination unit 54 may be a rotation abnormality (for example, the occurrence of slip) or another abnormality (for example, the abnormality of the device).

Specifically, for example, the abnormality determination unit 54 calculates a difference or a ratio between the rotation speed (actual rotation speed) calculated by the rotation speed calculation unit 52 and the set value (set rotation speed) of the rotation speed acquired from the rotation speed setting unit 56, and, in a case where the difference or the ratio exceeds a predetermined threshold (for example, a case where the actual rotation speed decreases by 10% or more as compared with the set rotation speed), determines that there is the rotation abnormality (for example, the occurrence of slip).

In the cleaning device 16, when the rollers 42*a* to 42*d* wear and the diameter decreases, the peripheral speed of the rollers 42*a* to 42*d* decreases, and thus the rotation speed of the substrate W gradually decreases in proportion thereto. Therefore, the abnormality determination unit 54 may calculate a difference or a ratio between the rotation speed (actual rotation speed) calculated by the rotation speed calculation unit 52 and the set value (set rotation speed) of the rotation speed acquired from the rotation speed setting unit 56, and, in a case where the actual rotation speed gradually decreases compared to the set rotation speed, determine that there is the abnormality of the device (for example, the wear of the rollers 42*a* to 42*d*).

Alternatively, for example, in a case where the rotation speed (actual rotation speed) calculated by the rotation speed calculation unit 52 is zero, and the set value (set rotation speed) of the rotation speed acquired from the rotation speed setting unit 56 is not zero, or in a case where an abnormal sound is detected by the microphones 51*a* to 51*c*, the abnormality determination unit 54 may determine that there is an abnormality (for example, cracking of the wafer).

The abnormality determination unit 54 may determine the presence or absence of an abnormality in consideration of a fluctuation of a current flowing through a motor (not illustrated) that rotates the cleaning members 44*a* and 44*b*. In this case, the abnormality of a bearing or the like used in the rotation mechanism of the cleaning members 44*a* and 44*b* can be detected by considering the fluctuation of the current flowing through the motor (not illustrated) that rotates the cleaning members 44*a* and 44*b*.

The abnormality determination unit 54 may determine the presence or absence of an abnormality in consideration of the fluctuation (for example, a minute fluctuation of air flow near the notch) of the internal air pressure of the housing 41.

The abnormality determination unit 54 may determine the presence or absence of an abnormality in consideration of the fluctuation of the pressing force of the rollers 42*a* to 42*d* with respect to the peripheral edge part of the substrate W.

Referring to FIG. 5, in a case where the abnormality determination unit 54 determines that there is an abnormality, the abnormality reporting unit 55 may report the abnormality to a central control device 61 or a cloud server 62, or may transmit a stop signal to the rotation driving units 43*a* and 43*b* to instruct to stop the operation.

Note that at least a part of the rotation speed calculation unit 52, the display control unit 53, the abnormality determination unit 54, and the abnormality reporting unit 55 described above can be configured by one or a plurality of computers.

Although not illustrated, the cleaning device 16 may further include, in addition to the rollers 42*a* to 42*d*, a mechanism (for example, a driven roller) that actively generates a sound by hitting the notch of the peripheral edge part of the substrate W. In this case, the rotation speed calculation unit 52 can more clearly detect a periodic sound corresponding to the rotation speed of the substrate W by tuning to the generated sound. Here, the mechanism that actively generates a sound may be a mechanism that generates a sound of a specific frequency (for example, a frequency clearly different from a noise such as the sound (splashing sound) of the cleaning liquid flowing) or a mechanism that easily emits a generated sound.

Meanwhile, as described above, conventionally, there has been a technique of detecting a vibration generated in a roller when a notch of a rotationally driven substrate hits the roller, and determining whether or not a slip has occurred between the substrate and the roller on the basis of the detection of the vibration. However, since a vibration sensor for detecting vibration is integrally attached to one roller among a plurality of rollers, the vibration generated when the notch of the substrate hits the roller can be detected only once during one rotation of the substrate. Therefore, in order to accurately obtain the rotation speed of the substrate on the basis of the vibration generated when the notch of the substrate hits the roller, it is necessary to take a sufficient measurement time. In order to shorten the measurement time, it is conceivable to attach the vibration sensor to each roller, but in this case, a device configuration becomes complicated and the cost increases.

On the other hand, according to the present embodiment as described above, for example, in a case where the number of rollers 42*a* to 42*d* is N (N is a natural number of 2 or more), the notch passes through the N rollers 42*a* to 42*d* during one rotation of the substrate W, so that the sound generated when the notch hits the rollers 42*a* to 42*d* can be detected N times by one microphone 51*a* or 51*b*. Therefore, as compared with a case where the vibration generated when the notch hits the roller is detected by one vibration sensor, the resolution can be increased N times, whereby the rotation speed (actual rotation speed) of the substrate W can be accurately obtained in a short time without complicating the device configuration.

In addition, as a result of actual verification by the present inventors, it has been found that, in a case where the microphone 51*a* is disposed outside the housing 41, the detection accuracy of the sound generated when the notch of the substrate W hits the rollers 42*a* to 42*d* can be improved as compared with a case where the microphone 51*b* is disposed inside the housing 41. Therefore, according to the present embodiment, at least one microphone 51*a* is disposed outside the housing 41, so that the rotation speed of the substrate W can be obtained more accurately. In addition, since the at least one microphone 51*a* is disposed outside the housing 41, waterproof processing of the microphone 51*a* is unnecessary, and even in a case where a flammable cleaning liquid is used, explosion prevention processing of the microphone 51*a* is unnecessary.

In a case where the frequency of the sound fluctuates, the fluctuation amount of the peak waveform becomes larger for the higher harmonics (for example, a fluctuation amount of 1% of the fundamental wave of 100 Hz is 1 Hz, but a fluctuation amount of 1% of the second harmonic of 200 Hz is 2 Hz, which is twice the fluctuation amount of the fundamental wave). Therefore, according to the present embodiment, the rotation speed calculation unit 52 calculates the rotation speed (actual rotation speed) of the substrate W using not only the fundamental wave of the sound detected by the microphone 51 but also harmonics, so that the rotation speed (actual rotation speed) of the substrate W can be obtained more accurately.

Although the embodiment and modification have been described above by way of illustration, the scope of the present technology is not limited to these and can be changed or modified according to the purpose within the scope described in the claims. Further, each embodiment and modification can be appropriately combined within a range that the processing contents do not contradict each other.

The invention claimed is:

1. A cleaning device comprising:
   a plurality of rollers that hold a peripheral edge part of a substrate;
   a rotation driving unit that rotates the substrate by rotationally driving the plurality of rollers;
   a cleaning member that abuts on the substrate and cleans the substrate;
   a cleaning liquid supply nozzle that supplies a cleaning liquid to the substrate;
   a microphone that detects a sound generated when a notch of the peripheral edge part of the substrate hits the plurality of rollers;
   a rotation speed calculation unit that calculates a rotation speed of the substrate on a basis of the sound detected by the microphone; and
   a housing that defines a cleaning space in which the substrate is cleaned, wherein
   the plurality of rollers, the cleaning member, and the cleaning liquid supply nozzle are disposed inside the housing, and
   at least one microphone is disposed outside the housing.

2. The cleaning device according to claim 1, wherein the microphone collects a sound generated inside the housing from a ventilation gap provided in the housing.

3. The cleaning device according to claim 1, wherein the rotation speed calculation unit calculates a rotation speed of the substrate on a basis of a fundamental wave and a harmonic of the sound.

4. The cleaning device according to claim 1, further comprising
   a vibration sensor that detects a vibration generated when the notch of the peripheral edge part of the substrate hits one of the plurality of rollers, wherein
   the rotation speed calculation unit calculates the rotation speed of the substrate on a basis of the sound detected by the microphone and the vibration detected by the vibration sensor.

5. The cleaning device according to claim 1, further comprising
   a second microphone that detects a sound generated from the rotation driving unit, wherein
   the rotation speed calculation unit calculates the rotation speed of the substrate on a basis of the sound detected by the microphone and the sound detected by the second microphone.

6. The cleaning device according to claim 1, wherein the rotation speed calculation unit calculates the rotation speed of the substrate in consideration of the set value acquired from a rotation speed setting unit that sets a set value of the rotation speed of the substrate in the rotation driving unit.

7. The cleaning device according to claim 6, wherein the rotation speed calculation unit changes a cutoff frequency of a filter applied to a signal of the sound according to the set value.

8. The cleaning device according to claim 1, further comprising
   a display control unit that controls a display to display the rotation speed calculated by the rotation speed calculation unit.

9. The cleaning device according to claim 8, wherein the display control unit averages a plurality of past rotation speeds calculated by the rotation speed calculation unit and controls the display to display the average.

10. A cleaning device comprising:
    a plurality of rollers that hold a peripheral edge part of a substrate;
    a rotation driving unit that rotates the substrate by rotationally driving the plurality of rollers:
    a cleaning member that abuts on the substrate and cleans the substrate;
    a cleaning liquid supply nozzle that supplies a cleaning liquid to the substrate;
    a microphone that detects a sound generated when a notch of the peripheral edge part of the substrate hits the plurality of rollers;
    a rotation speed calculation unit that calculates a rotation speed of the substrate on a basis of the sound detected by the microphone;
    a housing that defines a cleaning space in which the substrate is cleaned; and
    an abnormality determination unit that determines a presence or absence of an abnormality on a basis of the rotation speed calculated by the rotation speed calculation unit, wherein
    the abnormality determination unit determines the presence or absence of an abnormality in consideration of a fluctuation of an internal air pressure of the housing.

11. The cleaning device according to claim 10, wherein the abnormality determination unit determines the presence or absence of an abnormality on a basis of an average value of the plurality of past rotation speeds calculated by the rotation speed calculation unit.

12. The cleaning device according to claim 10, further comprising
    an abnormality reporting unit that reports the abnormality and/or instructs the rotation driving unit to stop in a case where the abnormality determination unit determines that there is an abnormality.

13. The cleaning device according to claim 10, wherein the abnormality determination unit calculates a difference or a ratio between the rotation speed calculated by the rotation speed calculation unit and the set value acquired from a rotation speed setting unit that sets a set value of the rotation speed of the substrate in the rotation driving unit, and determines that there is an abnormality in a case where the difference or the ratio exceeds a predetermined threshold.

14. The cleaning device according to any one of claim 10, wherein
the abnormality determination unit determines that there is an abnormality in a case where the rotation speed calculated by the rotation speed calculation unit is zero and the set value acquired from a rotation speed setting unit that sets a set value of the rotation speed of the substrate in the rotation driving unit is not zero or in a case where an abnormal sound is detected by the microphone.

15. The cleaning device according to claim 10, wherein
the abnormality determination unit determines the presence or absence of an abnormality in consideration of a fluctuation of a current flowing through a motor that rotates the cleaning member.

16. The cleaning device according to claim 10, wherein
the plurality of rollers, the cleaning member, and the cleaning liquid supply nozzle are disposed inside the housing, and
the microphone is disposed only inside the housing.

17. A polishing device comprising:
a polishing unit that polishes a substrate; and
a cleaning unit that cleans the substrate after polishing, wherein
the cleaning unit has
a plurality of rollers that hold a peripheral edge part of the substrate,
a rotation driving unit that rotates the substrate by rotationally driving the plurality of rollers,
a cleaning member that abuts on the substrate and cleans the substrate,
a cleaning liquid supply nozzle that supplies a cleaning liquid to the substrate,
a microphone that detects a sound generated when a notch of the peripheral edge part of the substrate hits the plurality of rollers,
a rotation speed calculation unit that calculates a rotation speed of the substrate on a basis of the sound detected by the microphone, and
a housing that defines a cleaning space in which the substrate is cleaned, and wherein
the plurality of rollers, the cleaning member, and the cleaning liquid supply nozzle are disposed inside the housing, and
at least one microphone is disposed outside the housing.

18. A device that calculates a rotation speed of a substrate in a cleaning device including
a plurality of rollers that hold a peripheral edge part of the substrate,
a rotation driving unit that rotates the substrate by rotationally driving the plurality of rollers,
a cleaning member that abuts on the substrate and cleans the substrate,
a cleaning liquid supply nozzle that supplies a cleaning liquid to the substrate, and
a housing that defines a cleaning space in which the substrate is cleaned,
the device comprising:
a microphone that detects a sound generated when a notch of a peripheral edge part of the substrate hits the plurality of rollers;
a rotation speed calculation unit that calculates the rotation speed of the substrate on a basis of the sound detected by the microphone; and
an abnormality determination unit that determines a presence or absence of an abnormality on a basis of the rotation speed calculated by the rotation speed calculation unit, wherein
the abnormality determination unit determines the presence or absence of an abnormality in consideration of a fluctuation of an internal air pressure of the housing.

19. A method that calculates a rotation speed of a substrate in a cleaning device including
a plurality of rollers that hold a peripheral edge part of the substrate,
a rotation driving unit that rotates the substrate by rotationally driving the plurality of rollers,
a cleaning member that abuts on the substrate and cleans the substrate,
a cleaning liquid supply nozzle that supplies a cleaning liquid to the substrate, and
a housing that defines a cleaning space in which the substrate is cleaned,
the method comprising steps of:
detecting, by a microphone, a sound generated when a notch of a peripheral edge part of the substrate hits the plurality of rollers, wherein the plurality of rollers, the cleaning member, and the cleaning liquid supply nozzle are disposed inside the housing, and at least one microphone is disposed outside the housing; and
calculating the rotation speed of the substrate on a basis of the sound detected by the microphone.

20. A polishing device comprising:
a polishing unit that polishes a substrate; and
a cleaning unit that cleans the substrate after polishing, wherein
the cleaning unit has
a plurality of rollers that hold a peripheral edge part of the substrate,
a rotation driving unit that rotates the substrate by rotationally driving the plurality of rollers,
a cleaning member that abuts on the substrate and cleans the substrate,
a cleaning liquid supply nozzle that supplies a cleaning liquid to the substrate,
a microphone that detects a sound generated when a notch of the peripheral edge part of the substrate hits the plurality of rollers,
a rotation speed calculation unit that calculates a rotation speed of the substrate on a basis of the sound detected by the microphone,
a housing that defines a cleaning space in which the substrate is cleaned, and an abnormality determination unit that determines a presence or absence of an abnormality on a basis of the rotation speed calculated by the rotation speed calculation unit, and wherein the abnormality determination unit determines the presence or absence of an abnormality in consideration of a fluctuation of an internal air pressure of the housing.

21. A device that calculates a rotation speed of a substrate in a cleaning device including
a plurality of rollers that hold a peripheral edge part of the substrate,
a rotation driving unit that rotates the substrate by rotationally driving the plurality of rollers,
a cleaning member that abuts on the substrate and cleans the substrate, a cleaning liquid supply nozzle that supplies a cleaning liquid to the substrate, and a housing that defines a cleaning space in which the substrate is cleaned, the device comprising:

a microphone that detects a sound generated when a notch of a peripheral edge part of the substrate hits the plurality of rollers; and a rotation speed calculation unit that calculates the rotation speed of the substrate on a basis of the sound detected by the microphone, wherein the plurality of rollers, the cleaning member, and the cleaning liquid supply nozzle are disposed inside the housing, and at least one microphone is disposed outside the housing.

22. A method that calculates a rotation speed of a substrate in a cleaning device including a plurality of rollers that hold a peripheral edge part of the substrate, a rotation driving unit that rotates the substrate by rotationally driving the plurality of rollers, a cleaning member that abuts on the substrate and cleans the substrate, a cleaning liquid supply nozzle that supplies a cleaning liquid to the substrate, and a housing that defines a cleaning space in which the substrate is cleaned, the method comprising steps of:

detecting, by a microphone, a sound generated when a notch of a peripheral edge part of the substrate hits the plurality of rollers;

calculating the rotation speed of the substrate on a basis of the sound detected by the microphone; and determining a presence or absence of an abnormality on a basis of the calculated rotation speed, wherein the presence or absence of an abnormality is determined in consideration of a fluctuation of an internal air pressure of the housing.

* * * * *